(12) United States Patent
Chen et al.

(10) Patent No.: US 8,835,082 B2
(45) Date of Patent: Sep. 16, 2014

(54) METHOD AND SYSTEM FOR E-BEAM LITHOGRAPHY WITH MULTI-EXPOSURE

(75) Inventors: Pei-Shiang Chen, Hsinchu (TW); Hung-Chun Wang, Taichung (TW); Jeng-Horng Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/562,877

(22) Filed: Jul. 31, 2012

(65) Prior Publication Data

US 2014/0038107 A1    Feb. 6, 2014

(51) Int. Cl.
*G03F 7/20*    (2006.01)

(52) U.S. Cl.
USPC ............. 430/30; 430/296; 430/394; 430/942

(58) Field of Classification Search
CPC ..... G03F 7/203; G03F 7/2037; G03F 7/2059; G03F 7/2061
USPC .................... 430/30, 296, 394, 942
See application file for complete search history.

(56) References Cited

U.S. PATENT DOCUMENTS

| 7,264,909 | B2 * | 9/2007 | Nakasugi | 430/30 |
| 7,799,489 | B2 * | 9/2010 | Fujimura et al. | 430/5 |
| 8,124,319 | B2 * | 2/2012 | Huang et al. | 430/296 |

* cited by examiner

*Primary Examiner* — Christopher Young
(74) *Attorney, Agent, or Firm* — Haynes and Boone, LLP

(57) ABSTRACT

The present disclosure provides a method for electron-beam (e-beam) lithography patterning. The method includes forming a resist layer on a substrate; performing a first e-beam exposure process to the resist layer according to a first pattern; performing a second e-beam exposure process to the resist layer according to a second pattern, wherein the second patterned is overlapped to the first pattern on the resist layer; and developing the resist layer.

20 Claims, 4 Drawing Sheets

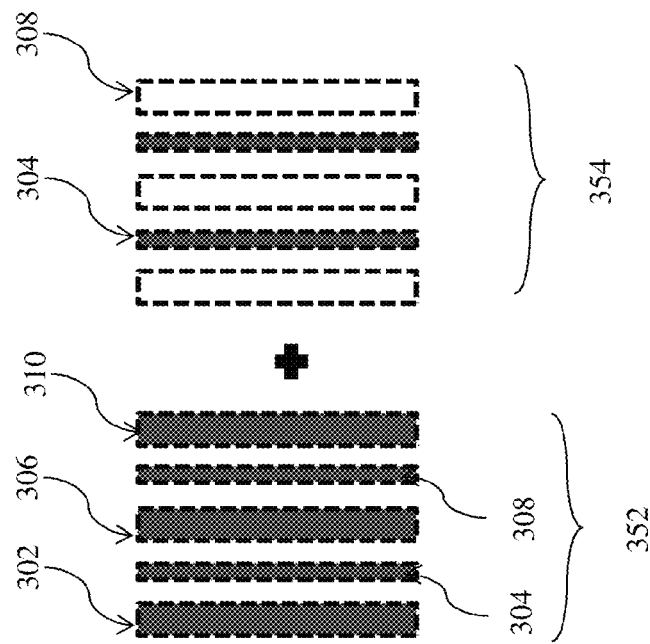
Fig. 6
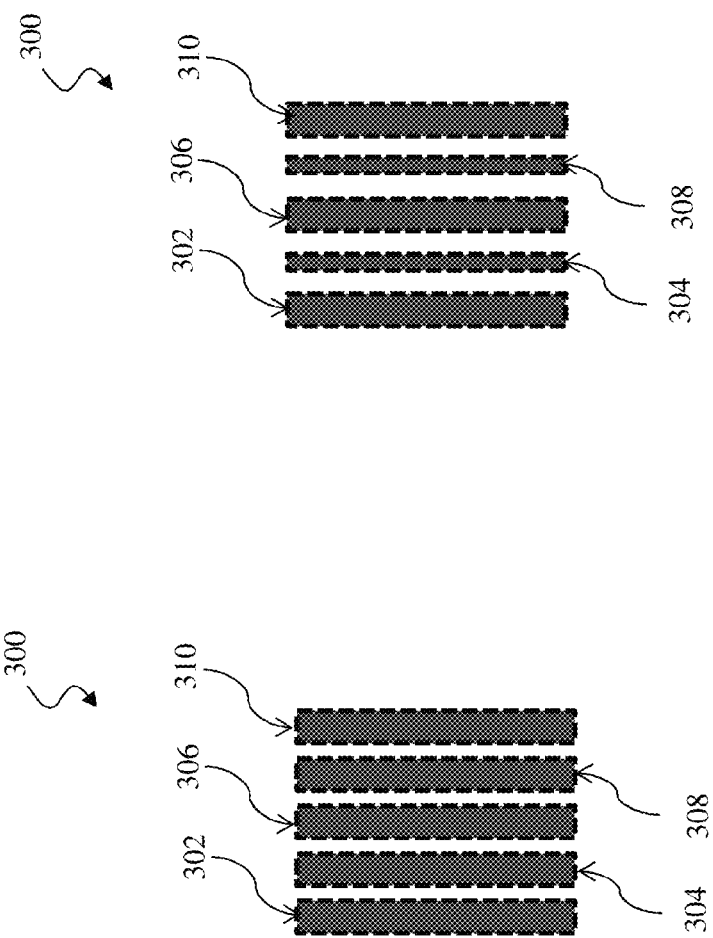
Fig. 5
Fig. 4

METHOD AND SYSTEM FOR E-BEAM LITHOGRAPHY WITH MULTI-EXPOSURE

BACKGROUND

Semiconductor integrated circuit (IC) fabrication involves forming multiple material layers with designed patterns on a semiconductor wafer. Those patterned material layers on the semiconductor wafer are aligned and configured to form one or more functional circuits. Photolithography systems are used to pattern a semiconductor wafer. When semiconductor technology continues progressing to circuit layouts having smaller feature sizes, a lithography system with higher resolution is need to image an IC pattern with smaller feature sizes. An electron-beam (e-beam) system is introduced for lithography patterning processes as the electron beam has wavelengths that can be tuned to very short, resulting in very high resolution. An e-beam lithography can write small features to a wafer but takes longer time. The corresponding fabrication cost is higher and cycle time is too long. Multiple e-beam lithography is introduced and it reduces the cycle time. However, in the raster-scan multiple e-beam lithography, it is limited to only single exposure dosage. For some hot spots in the IC design layout, the pattern contrast is poor and the process window is small.

It is desired, therefore, to provide an e-beam lithography method and a system for e-beam lithography pattern in IC fabrication to address the above issues.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Furthermore, all features may not be shown in all drawings for simplicity.

FIG. 4 is a top view of an IC pattern constructed according to various aspects of the present disclosure in one or more embodiments.

FIG. 5 is a top view of the IC patterns of FIG. 4 after various corrections constructed according to various aspects of the present disclosure in one or more embodiments.

FIG. 6 is a top view of various patterns extracted from the IC pattern of FIG. 4 constructed according to various aspects of the present disclosure in one or more embodiments.

DETAILED DESCRIPTION

Figure 1:
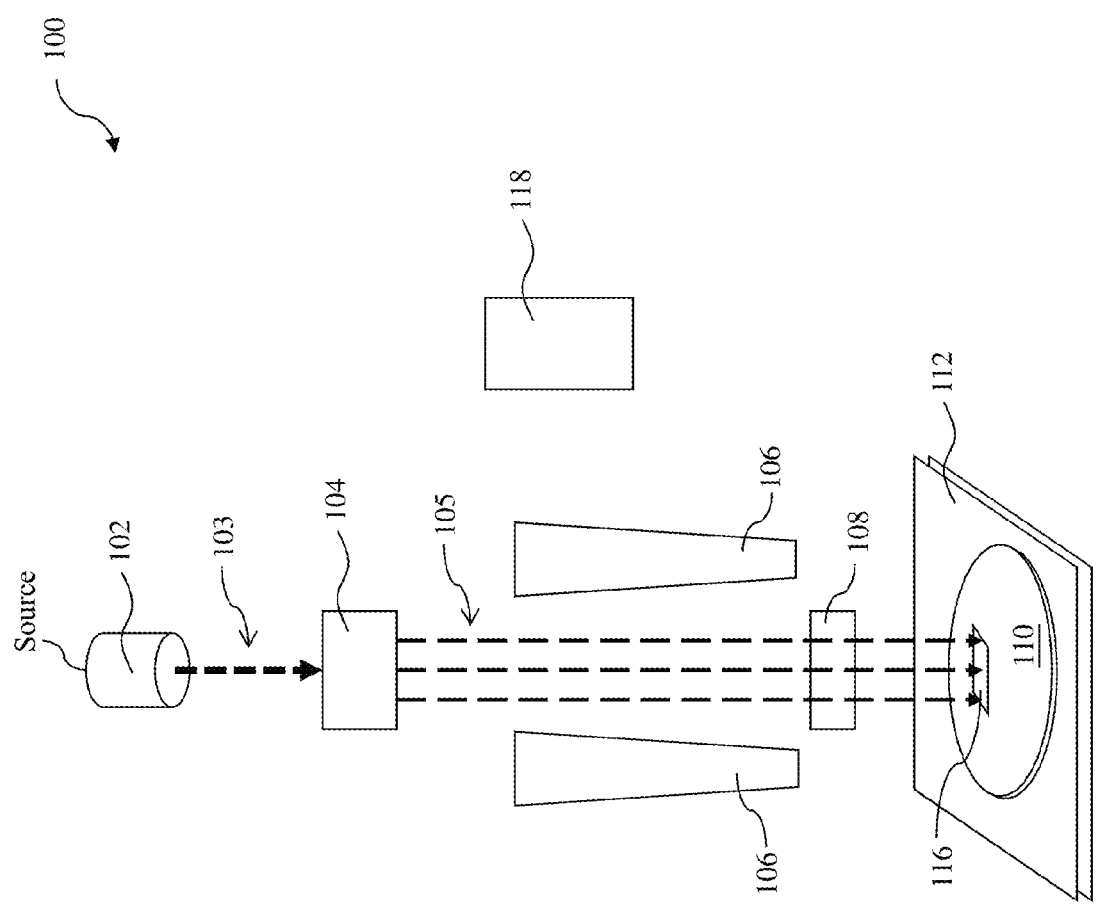
FIG. 1 is a diagrammatic view of one embodiment of an electron-beam (e-beam) lithography system for integrated circuit (IC) patterning constructed according to aspects of the present disclosure.

The present disclosure relates generally to lithography systems and a method of utilizing such systems. It is understood, however, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1 illustrates a schematic view of an electron-beam (or e-beam) lithography system 100 constructed according to aspects of one embodiment of the present disclosure. The electron-beam lithography system 100 is an electron-based lithography technique that utilizes an electron-based imaging for various integrated circuits (IC) patterning. The electron-beam lithography system 100 transfers an IC design pattern to an e-beam sensitive resist (e-beam-resist) layer coated on a semiconductor wafer. The electron-beam lithography system 100 provides a higher imaging resolution than that of an optical lithography because an electron beam can be energized to have a shorter wavelength. The e-beam lithography system 100 may write an IC pattern to an e-beam resist layer.

The electron-beam lithography system 100 includes a particle source 102 to provide a particle beam. In the present embodiment, the particle source is an electron source and the particle beam is an electron beam. In furtherance of the embodiment, the source 102 is an electron gun with a mechanism to generate electrons, such as by thermal electron emission. In a particular example, the electron gun includes a tungsten (or other suitable material) filament designed and biased to thermally emit electrons. An electron beam 104 is illustrated as an electron beam from the source 102. For example, an e-beam 103 is generated by the e-beam source 102.

The electron-beam lithography system 100 further includes a multi-beam mechanism 104 that is operable to generate multiple e-beams from the electron source 102. In one embodiment, the mechanism 104 to generate multiple e-beams includes an aperture array having a plurality of openings designed and configured to generate multiple e-beams 105 in an array. In the present example, the e-beam 103 from the e-beam source 102 has or is tuned to have a large spot over the aperture array with a uniform space distribution. The aperture array splits the e-beam 103 from the source 102 to the plurality of e-beams 105. In one embodiment, the aperture array of the multi-beam mechanism 104 may be designed such that the openings of the aperture array are tunable in terms of size, shape and/or location. In furtherance of the embodiment, the openings may be further dynamically tunable over time. In another embodiment, the e-beam 103 from the e-beam source 102 may be further processed to have a proper beam spot and uniformity by various electron lenses.

The electron-beam lithography system 100 includes one or more lenses 106 to impact the electron incident beams 105 from the multi-beam mechanism 104 for imaging effect. In one embodiment, the lenses 106 includes a condenser lens to focus the electron beam 104 into smaller diameter, and further includes an objective lens properly configured. Various lenses, such as magnets, are designed to provide force to the electrons for proper imaging effect, such as focusing.

The electron-beam lithography system 100 also includes a blanker 108 designed to switch an e-beam on or off. In the present embodiment, the blanker 108 is designed and configured to switch the multiple e-beams 105 on/off individually. The electron-beam lithography system 100 also includes a deflector (not shown) to deflect an electron beam for scanning and exposing a certain region of a substrate in a certain mode, such as raster mode. In the present embodiment, the substrate to be exposed is a wafer 110, such as a silicon wafer, for integrated circuits. The deflector is operable to direct an electron beam to the wafer 110 positioned on a wafer stage 112. In one example, the deflector may include one or more coils to deflect the electron beam in two orthogonal directions such that the electron beam is scanned over a surface area of the wafer 110.

In the present embodiment, the wafer 110 is coated with a resist layer to be patterned in a lithography process using the electron-beam lithography system 100. The resist layer includes a resist material sensitive to electrons (so also referred to as e-beam resist). The resist material includes a component that resist to an IC fabrication process, such as etch and/or ion implantation. The resist material further includes a component sensitive to electrons. The resist material may be negative tone or positive tone. In one example, the resist material includes polymethyl methacrylate (PMMA).

In one embodiment, the wafer stage 112 is operable to move such that an e-beam is directed to various locations of the resist layer on the wafer 110. In one example, the wafer stage 112 and the deflector are designed to coordinately move the e-beam(s) relative to the wafer 110. Particularly, in the present embodiment, the wafer 110 includes a plurality of regions (fields) 116 to be patterned. In the present embodiment, the multiple e-beams 105 are controlled to write on the wafer 116 in parallel for reduced cycle time and increased throughput. However, the intensity of each e-beam is not able to be independently tuned according the present embodiment of the electron-beam lithography system 100. The disclosed method associated with the electron-beam lithography system 100 is designed to address that concern.

The electron-beam lithography system 100 also includes a control module 118 integrated and coupled with various components of the electron-beam lithography system 100. The control module 118 is controllable to write multiple times to a same resist layer with respective patterns. Each writing process utilizes multiple e-beams of the electron-beam lithography system 100.

In one embodiment, two or more patterns are extracted from an IC design layout such that the electron-beam lithography system 100 is able to write the resist layer two or more times with respective patterns to achieve different exposure dosage for enhanced contrast, especially for critical features. For example, the control module 118 controls to write a first pattern on the resist layer utilizing multiple e-beams and write a second pattern on the resist layer utilizing multiple e-beams. The first and second patterns are overlapped on the resist layer and collectively determine the total exposure dose distribution over various features in the IC design layout. The disclosed method will be described later.

In one embodiment, the electron-beam lithography system 100 further includes a pattern processing module coupled with the control module 118 for extracting various patterns from the IC design layout; providing the various patterns to the control module 118 for multiple e-beam exposure process; or additionally performing various corrections to the IC design layout.

In another embodiment, the pattern processing module is integrated with the control module 118. In an alternative embodiment, the pattern processing module is distributed in the semiconductor manufacturer and is coupled with the electron-beam lithography system 100. For example, the pattern processing module is a portion of the semiconductor manufacturer to perform various pattern processing operations and is coupled with the pattern processing module through the Internet or an intranet.

The electron-beam lithography system 100 may further include other components and modules. In one example, the electron-beam lithography system 100 includes a module to check and monitor alignment and overlay during a lithography exposure process.

Figure 2:
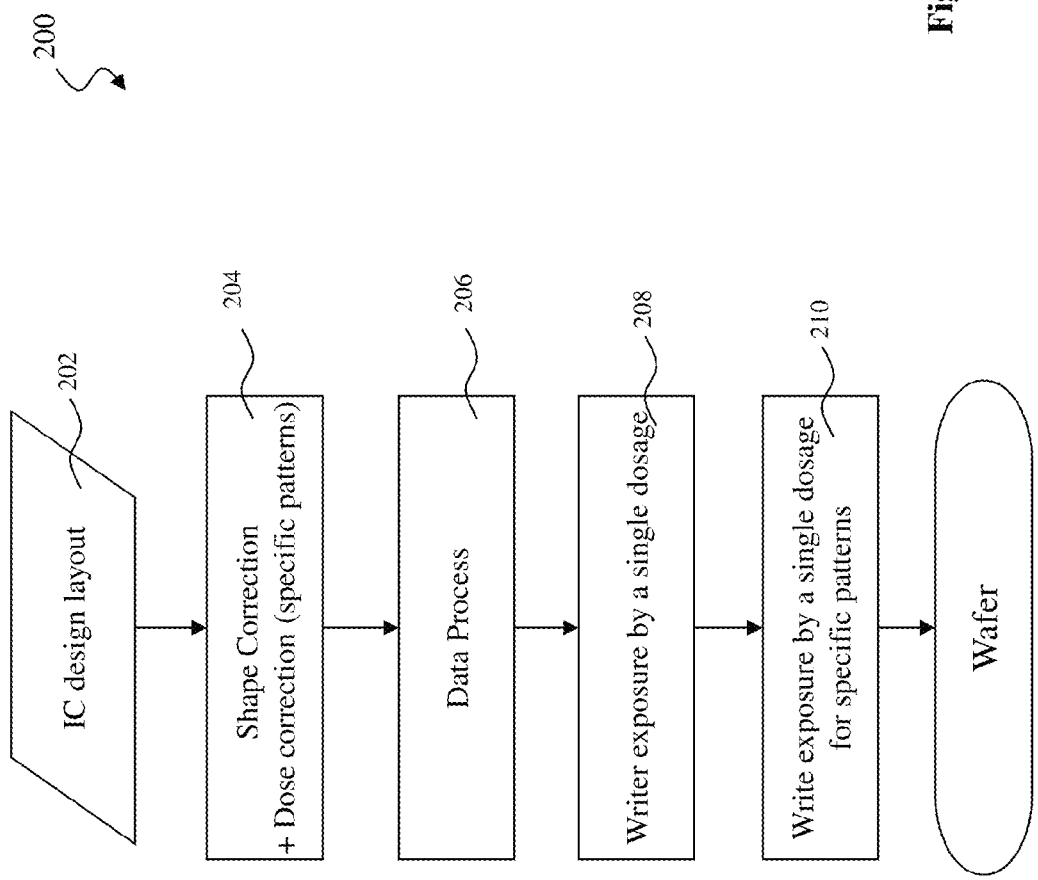
FIG. 2 is a flowchart of a method for performing an e-beam lithography process according to aspects of the present disclosure in one embodiment.

FIG. 2 is a flowchart of a method 200 to achieve multiple e-beam exposure lithography patterning constructed according to various aspects of the present disclosure in one embodiment. The method 200 begins at 202 with an IC design layout for an integrated circuit to be formed on one or more semiconductor wafers. The IC design layout may be received from an IC design house, for example. In the present embodiment, the IC design layout represents an IC pattern to be formed in one material layer on the wafer(s). The IC design layout includes one or more circuit features to be formed a same material layer on the wafer. In various examples, the IC design layout defines STI features, gate electrodes, source/drain features, contact features, metal lines or via features, to name a few. FIG. 4 is a schematic view of an IC design layout 300 constructed according to one example. The IC design layout 300 includes various circuit features 302, 304, 306, 308 and 310. The IC design layout 300 is only provided for illustration.

The method 200 includes an operation 204 for shape correction and dose correction. The shape correction includes modifying circuit features and adding assist features such that the imaged pattern on the wafer properly represents the expected design features. In one embodiment, the shape correction corrects the proximity effect, which is referred to as optical proximity correction (OPC) in photolithography. In the e-beam lithography, it is referred to as e-beam proximity correction (EPC). Proximity effect in the e-beam lithography includes electron scattering effect in one example. In another embodiment, the shape correction includes critical dimension (CD) modification associated with various loading effect, such as e-beam exposure loading bias and/or etching bias. The loading effect is related to the pattern density. For example, an isolated pattern and a dense pattern may have a different bias, leading to CD variation. In yet another embodiment, shape correction includes geometry modifications to IC design layout in consideration of e-beam lithography technology limitations. For example, when two features are closed to each other with a less spacing beyond the resolution of the e-beam lithography technology, the spacing may be modified to avoid such issue.

As one example associated with the IC design layout 300, the widths of the circuit features 304 and 308 are reduced to smaller widths by the shape correction as illustrated in FIG. 5.

The dose correction adjusts the e-beam exposure dose such that various circuit features are able to be imaged on the resist layer with higher contrast or increased contrast. When all circuit features are written with a same dose, some circuit features, especially critical features, do not have enough contrast. The dose correction tunes exposure dose over circuit features for better imaging effect. Particularly, the dose correction may be applied only to certain features or a subset of the circuit features in the IC design layout. For example, the dose correction is applied only to critical features. In this case, critical features are identified for those features with poor imaging effect. The exposure dose to the critical features is modified to a different dose level for increased imaging contrast and imaging resolution. In one embodiment, a subset of the circuit features in the IC design layout is identified as critical features and is corrected with a different exposure dose (or with an additional exposure).

For example associated with the IC design layout 300, the circuit features 304 and 308 are identified as critical features, the corresponding exposure dose is tuned to a dose different from the exposure dose for other circuit features (such as 302, 306 and 310). In other words, the circuit features 302, 306 and 310 are assigned with a first dose and the circuit features 304 and 308 are assigned with a second dose different from the first dose. In the present case, the second dose is greater than the first dose. In other examples, more than two different dose levels may be assigned to various circuit features.

The method 200 may include an operation 206 for data processing to the IC design layout. The data processing is an operation to modify the IC design layout (or features in the IC design layout) to compensate for the variations or errors associated with the e-beam lithography system to be used to implement the lithography process that forms an image of the IC design layout to the wafer. In the present example, the e-beam lithography system 100 is used for that purpose. In one example, one lithography tool related variation includes e-beam intensity variation from one e-beam to another e-beam for the multiple e-beam lithography system. The modification to the IC design layout by the data processing includes modification to the exposure dose of various features (such as one group of features to be exposed by a first e-beam and another group of featured to be exposed by a second e-beam) in the IC design layout. In a particular example, the exposure dose is changed by changing the pixel density of the circuit features.

The IC design layout after the shape correction and dose correction is provided to the e-beam lithography system, such as the system 100, for the lithography exposure utilizing multiple exposures. In the present embodiment, the multiple exposures utilize multiple e-beam writing. A wafer is coated with an e-beam sensitive resist layer and is patterned by an e-beam lithography process. A typical lithography procedure may include coating, baking, exposure, post-exposure baking, developing and baking according to one embodiment. Particularly, the method 200 includes an operation 208 to perform a first e-beam exposure process to a first pattern of the IC design layout. The first e-beam exposure process includes exposing the resist layer according to the first pattern in a raster writing mode (raster mode). In one embodiment, the first pattern includes all features in the IC design layout. In furtherance of the embodiment, the first e-beam exposure process uses a first single exposure dose through the multiple e-beam raster writing. Here a single dose means the dose will remain the same during the raster writing.

The method 200 also includes an operation 210 to perform a second e-beam exposure process to a second pattern of the IC design layout. The second e-beam exposure process includes exposing the resist layer according to the second pattern in a raster writing mode (raster mode). The second pattern is different from the first pattern and is extracted from the IC design layout. In one embodiment, the second pattern is a subset of all features in the IC design layout, therefore is also a subset of the first pattern. In furtherance of the embodiment, the second pattern includes critical features of the IC design layout. In the present embodiment, the second e-beam exposure process uses a second single exposure dose through the multiple e-beam raster writing. In one example, the second single dose is same as the first single dose. In another example, the second single dose is different from the first single dose.

In one example associated with IC design layout 300 as illustrated in FIG. 6, the first pattern 352 includes all features (302, 304, 306, 308 and 310) of the IC design layout. The second pattern 354 includes a subset of all features of the IC design layout. In this example, the second pattern 354 includes circuit features 304 and 308.

By the first and second e-beam exposure processes, the total exposure dose for the features of the IC design layout in the second pattern is the sum of the first single dose and the second single dose. The total exposure for the features of IC design layout in the first pattern is only the first single dose. Particularly, the first pattern and the second pattern are overlapped. In the present embodiment, the second pattern is a subset of the first pattern. Therefore, the second pattern is overlapped with the second pattern in the regions for various features in the second pattern.

In other embodiments, more than two exposure processes are implemented. For example, the method 200 includes a third e-beam exposure process to a third pattern of the IC design layout. The third e-beam exposure process includes exposing the resist layer according to the third pattern in a raster writing mode (raster mode). The third pattern is different from the first pattern and second pattern. The third pattern is extracted from the IC design layout. In one embodiment, the third pattern is a subset of all features in the IC design layout, therefore is also a subset of the first pattern but different from the second pattern. For example, the third pattern is another subset of the first pattern. In another example, the third pattern is a subset of the second pattern and includes further less features of the IC design layout. In the present embodiment, the third e-beam exposure process uses a third single exposure dose through the multiple e-beam raster writing. In one example, the third single dose is same as the first single dose. In another example, the third single dose is different from the first single dose.

Thus, two or more exposure dose levels are achieved by multiple e-beam exposure procedure of the method 200. In the present embodiment, the method 200 utilizes e-beam writing lithography in the raster mode, especially with the e-beam lithography system 100 having single e-beam source and multiple e-beams. For the system 100, the e-beam intensity or e-beam exposure has limited freedom to vary exposure dose over time and location. By implementing the method 200 with multiple exposures, various exposure dose levels are achieved for enhanced contrast and imaging quality of the lithography patterning. Since the first and second e-beam (or more than two) exposure processes are implemented to the same resist layer of the wafer in the same e-beam lithography system, such as the system 100, the fabrication time is reasonable as the multiple loading/unloading and pumping are avoided. Furthermore, the multiple e-beam technique is used with multiple e-beams writing in parallel, the e-beam writing time is substantially reduced but the lithography imaging quality is not sacrificed due to the multiple exposure dose levels achieved by the disclosed method. In one embodiment, the e-beam lithography system 100 is designed and configured to be able to perform various operations of the method 200. For example, the first and second patterns may be generated from the IC design layout by the system 100.

Other operations may be includes in the method 200, before, during or after the various operations described above. For example, after the multiple exposure procedure, a post-exposure baking process is applied to the resist layer. In another example, after the post-exposure process, the resist layer is developed to form a patterned resist layer with various openings that define etch, ion implantation or deposition regions. In yet another example, an ion implantation or etch process is applied to the wafer using the pattern resist layer as an ion implantation mask or etch mask. In yet another example, the patterned resist layer is removed by wet stripping or plasma ashing after the subsequent process (such as ion implantation or etch).

Figure 3:
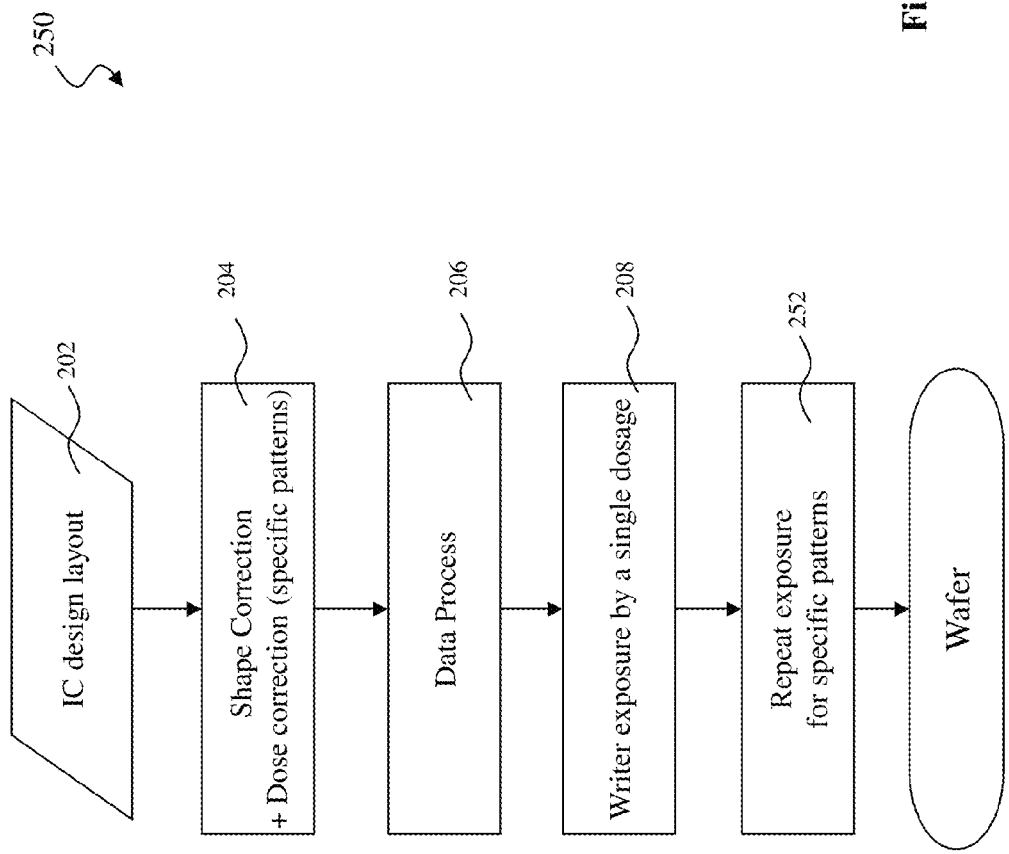
FIG. 3 is a flowchart of a method for performing an e-beam lithography process according to aspects of the present disclosure in another embodiment.

FIG. 3 is a flowchart of a method 250 to achieve multiple e-beam exposure lithography patterning constructed according to various aspects of the present disclosure in another embodiment. The method 250 is a hybrid method of a multiple e-beam exposure process that includes raster writing and vector writing in multiple exposures. The method 250 begins at 202 with an IC design layout for an integrated circuit to be formed on one or more semiconductor wafers. The IC design layout may be received from an IC design house, for example. In the present embodiment, the IC design layout represents an IC pattern to be formed in one material layer on the wafer(s). The IC design layout includes one or more circuit features to be formed a same material layer on the wafer. In various examples, the IC design layout defines STI features, gate electrodes, source/drain features, contact features, metal lines or via features, to name a few. FIG. 4 is one example of an IC design layout 300. The IC design layout 300 includes various circuit features 302, 304, 306, 308 and 310.

The method 250 includes an operation 204 for shape correction and dose correction. The shape correction includes modifying circuit features and adding assist features such that the imaged pattern on the wafer properly represents the expected design features. In one embodiment, the shape correction corrects the proximity effect, which is referred to as e-beam proximity correction. In another embodiment, the shape correction includes CD modification associated with various loading effect, such as e-beam exposure loading bias and/or etching bias. In yet another embodiment, shape correction includes geometry modifications to IC design layout in consideration of e-beam lithography technology limitations. For example, when two features are closed to each other with a less spacing beyond the resolution of the e-beam lithography technology, the spacing may be modified to avoid such issue. As one example associated with the IC design layout 300, the widths of the circuit features 304 and 308 are reduced to smaller widths by the shape correction as illustrated in FIG. 5.

The dose correction adjusts the e-beam exposure dose such that various circuit features are able to be imaged on the resist layer with higher contrast or increased contrast. When all circuit features are written with a same dose, some circuit features, especially critical features, do not have enough contrast. The dose correction tunes exposure dose over circuit features for better imaging effect. Particularly, the dose correction may be applied only to certain features or a subset of the circuit features in the IC design layout. For example, the dose correction is applied only to critical features. In this case, critical features are identified for those features with poor imaging effect. The exposure dose to the critical features is modified to a different dose level for increased imaging contrast and imaging resolution. In one embodiment, a subset of the circuit features in the IC design layout is identified as critical features and is corrected with a different exposure dose (or with an additional exposure).

For example associated with the IC design layout 300, the circuit features 304 and 308 are identified as critical features, the corresponding exposure dose is tuned to a dose different from the exposure dose for other circuit features (such as 302, 306 and 310). In other words, the circuit features 302, 306 and 310 are assigned with a first dose and the circuit features 304 and 308 are assigned with a second dose different from the first dose. In the present case, the second dose is greater than the first dose. In other examples, more than two different dose levels may be assigned to various circuit features.

The method 250 may include an operation 206 for data processing to the IC design layout. The data processing is an operation to modify the IC design layout (or features in the IC design layout) to compensate for the variations or errors associated with the e-beam lithography system to be used to implement the lithography process that forms an image of the IC design layout to the wafer. In the present example, the e-beam lithography system 100 is used for that purpose. In one example, one lithography tool related variation includes e-beam intensity variation from one e-beam to another e-beam for the multiple e-beam lithography system. The modification to the IC design layout by the data processing includes modification to the exposure dose of various features (such as one group of features to be exposed by a first e-beam and another group of featured to be exposed by a second e-beam) in the IC design layout. In a particular example, the exposure dose is changed by changing the pixel density of the circuit features.

The IC design layout after the shape correction and dose correction is provided to the e-beam lithography system, such as the system 100, for the lithography exposure utilizing multiple exposures. In the present embodiment, the multiple exposures utilize multiple e-beam writing. A wafer is coated with an e-beam sensitive resist layer and is patterned by an e-beam lithography process. A typical lithography procedure may include coating, baking, exposure, post-exposure baking, developing and baking according to one embodiment. Particularly, the method 200 includes an operation 208 to perform a first e-beam exposure process to a first pattern of the IC design layout. The first e-beam exposure process includes exposing the resist layer according to the first pattern in a raster writing mode (raster mode). In one embodiment, the first pattern includes all features in the IC design layout. In furtherance of the embodiment, the first e-beam exposure process uses a first single exposure dose through the multiple e-beam raster writing. Here a single dose means the dose will remain the same during the raster writing.

The method 250 also includes an operation 252 to perform a second e-beam exposure process to a second pattern of the IC design layout. The second e-beam exposure process includes exposing the resist layer according to the second pattern in a vector writing mode (vector mode). The second pattern is different from the first pattern and is extracted from the IC design layout. In one embodiment, the second pattern is a subset of all features in the IC design layout, therefore is also a subset of the first pattern. In furtherance of the embodiment, the second pattern includes critical features of the IC design layout. In the present embodiment, the second e-beam exposure process uses a second exposure dose through a single e-beam vector writing. In one example, the second dose is same as the first single dose. In another example, the second dose is different from the first single dose. In yet another example, the second dose varies over location as the e-beam intensity may be changed in the fly during vector writing.

As the second pattern includes much less features, the vector writing can be more efficient and may further take the advantage of the vector writing to vary the e-beam intensity. In the present embodiment, the second e-beam exposure process with e-beam writing in vector mode is implemented in another e-beam lithography system configured for single beam vector writing.

In one example associated with IC design layout 300 as illustrated in FIG. 6, the first pattern 352 includes all features (302, 304, 306, 308 and 310) of the IC design layout. The second pattern 354 includes a subset of all features of the IC design layout. In this example, the second pattern 354 includes circuit features 304 and 308.

By the first and second e-beam exposure processes, the total exposure dose for the features of the IC design layout in the second pattern is the sum of the first single dose and the second dose. The total exposure for the features of IC design layout in the first pattern is only the first single dose.

Thus, two or more exposure dose levels are achieved by multiple e-beam exposure procedure of the method 250 that includes raster writing and vector writing. In the present embodiment, the first e-beam exposure process utilizes e-beam writing lithography in the raster mode, especially with the e-beam lithography system 100 having single e-beam source and multiple e-beams. For the system 100, the e-beam intensity or e-beam exposure has limited freedom to vary exposure dose over time and location. By implementing the method 250 with multiple exposures, raster writing and vector writing are combined to achieve multiple exposure dose levels for enhanced contrast and imaging quality of the lithography patterning.

Various embodiments of the disclosed multiple exposure lithography method with e-beams are described above, other alternatives or modifications may be possible within the scope the present disclosure. In one example, even though only circuit features are described in the IC design layout, other non-circuit features may be included in the IC design layout. In another embodiment, the first pattern is also extracted from the IC design layout as a subset of various features thereof.

In other embodiment, the wafer may include other semiconductor substrate, such as a substrate having germanium, silicon germanium, gallium arsenic, or other proper semiconductor materials. The wafer may include various doped regions, dielectric features, and/or a portion of multilevel interconnects. In various embodiments, the wafer includes various doped features for various microelectronic components, such as a transistor, a diode, an imaging sensor, a memory cell, and/or a capacitive element. In another embodiment, the wafer includes conductive material features and dielectric material features configured for coupling and isolating various microelectronic components, respectively.

Thus, the present disclosure provides one embodiment of a method for electron-beam (e-beam) lithography patterning. The method includes forming a resist layer on a substrate; performing a first e-beam exposure process to the resist layer according to a first pattern; performing a second e-beam exposure process to the resist layer according to a second pattern, wherein the second patterned is overlapped to the first pattern on the resist layer; and developing the resist layer.

In one embodiment of the method, the performing a first e-beam exposure process includes writing the first pattern to the resist layer; and the performing a second e-beam exposure process includes writing the second pattern to the resist layer, wherein the second pattern is different from the first pattern. In another embodiment, the second pattern is a subset of the first pattern.

In another embodiment, the method further includes receiving an integrated circuit (IC) design layout; and generating the first pattern and the second pattern from the IC design layout.

In yet another embodiment, the generating the first pattern and the second pattern from the IC design layout includes applying a shape correction to the IC design layout; applying a dose correction to the IC design layout; and extracting the first pattern and the second pattern from the IC design layout based on the dose correction.

In yet another embodiment, the writing the first pattern to the resist layer includes writing the first pattern to the resist layer in a raster mode; and the writing the second pattern to the resist layer includes writing the second pattern to the resist layer in the raster mode.

In yet another embodiment, the writing the first pattern to the resist layer includes writing the first pattern to the resist layer in a multiple e-beam lithography system utilizing a multi-beam technique; and the writing the second pattern to the resist layer includes writing the second pattern to the resist layer in the multiple e-beam lithography system utilizing the multi-beam technique.

In yet another embodiment, the multiple e-beam lithography system includes one e-beam source to provide electrons; and a mechanism to generate a plurality of e-beams from the E-beam source.

In yet another embodiment, the writing the first pattern to the resist layer includes writing the first pattern to the resist layer using a first dose; and the writing the second pattern to the resist layer includes writing the second pattern to the resist layer using a second dose different from the first dose.

In yet another embodiment, the writing the first pattern to the resist layer includes writing the first pattern to the resist layer in a raster mode; and the writing the second pattern to the resist layer includes writing the second pattern to the resist layer in a vector mode.

In yet another embodiment, the writing the first pattern to the resist layer includes writing the first pattern to the resist layer in a multiple e-beam lithography system utilizing a multi-beam technique; and the writing the second pattern to the resist layer includes writing the second pattern to the resist layer in an e-beam lithography system utilizing a single e-beam.

In yet another embodiment, the writing the first pattern to the resist layer includes writing the first pattern to the resist layer using a fixed dose; and the writing the second pattern to the resist layer includes writing the second pattern to the resist layer using a varying dose.

In yet another embodiment, the resist layer includes a resist material sensitive to electrons.

The present disclosure also provides another embodiment of a method for electron-beam (e-beam) lithography patterning. The method includes receiving an integrated circuit (IC) structure; applying a shape correction to the IC structure; applying a dose correction to the IC structure; and generating a first pattern and a second pattern from the IC structure based on the dose correction, wherein the first and second patterns are used to form IC patterning in a multiple e-beam exposure process.

In one embodiment, the method further includes forming a resist layer on a substrate; performing a first e-beam exposure process to the resist layer according to the first pattern; performing a second e-beam exposure process to the resist layer according to the second pattern; and developing the resist layer.

In another embodiment, the performing a first e-beam exposure process includes writing the first pattern to the resist layer in raster mode; and the performing a second e-beam exposure process includes writing the second pattern to the resist layer in vector mode.

In yet another embodiment, the performing a first e-beam exposure process includes writing the first pattern to the resist layer in raster mode; and the performing a second e-beam exposure process includes writing the second pattern to the resist layer in raster mode.

In yet another embodiment, the second pattern is a subset of the first pattern. In yet another embodiment, the second pattern is extracted from the IC structure and includes features demanding additional exposure dose.

The present disclosure also provides an embodiment of an electron-beam (e-beam) lithography system. The system includes an e-beam source to provide electrons; a mechanism for generating multiple e-beams from the e-beam source; a substrate stage configured to hold a semiconductor that is coated with a resist layer; and a control module being controllable to write a first pattern to the resist layer and writing a second pattern to the resist layer utilizing multi-beam technique such that the first and second pattern are overlapped in a same region of the resist layer.

The present disclosure has been described relative to a preferred embodiment. Improvements or modifications that become apparent to persons of ordinary skill in the art only after reading this disclosure are deemed within the spirit and scope of the application. It is understood that several modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. A method for electron-beam (e-beam) lithography patterning, comprising:
   forming a resist layer on a substrate;
   performing a first e-beam exposure process to the resist layer according to a first pattern;
   performing a second e-beam exposure process to the resist layer according to a second pattern, wherein the second pattern is a subset of the first pattern; and
   developing the resist layer.

2. The method of claim 1, wherein:
   the performing the first e-beam exposure process includes writing the first pattern to the resist layer; and
   the performing the second e-beam exposure process includes writing the second pattern to the resist layer.

3. The method of claim 1, further comprising:
   receiving an integrated circuit (IC) design layout; and
   generating the first pattern and the second pattern from the IC design layout.

4. The method of claim 3, wherein the generating the first pattern and the second pattern from the IC design layout includes:
   applying a shape correction to the IC design layout;
   applying a dose correction to the IC design layout; and
   extracting the first pattern and the second pattern from the IC design layout based on the dose correction.

5. The method of claim 2, wherein:
   the writing the first pattern to the resist layer includes writing the first pattern to the resist layer in a raster mode; and
   the writing the second pattern to the resist layer includes writing the second pattern to the resist layer in the raster mode.

6. The method of claim 5, wherein:
   the writing the first pattern to the resist layer includes writing the first pattern to the resist layer in a multiple e-beam lithography system utilizing a multi-beam technique; and
   the writing the second pattern to the resist layer includes writing the second pattern to the resist layer in the multiple e-beam lithography system utilizing the multi-beam technique.

7. The method of claim 6, wherein the multiple e-beam lithography system includes:
   one e-beam source to provide electrons; and
   a mechanism to generate a plurality of e-beams from the e-beam source.

8. The method of claim 5, wherein:
   the writing the first pattern to the resist layer includes writing the first pattern to the resist layer using a first dose; and
   the writing the second pattern to the resist layer includes writing the second pattern to the resist layer using a second dose different from the first dose.

9. The method of claim 2, wherein:
   the writing the first pattern to the resist layer includes writing the first pattern to the resist layer in a raster mode; and
   the writing the second pattern to the resist layer includes writing the second pattern to the resist layer in a vector mode.

10. The method of claim 9, wherein:
    the writing the first pattern to the resist layer includes writing the first pattern to the resist layer in a multiple e-beam lithography system utilizing a multi-beam technique; and
    the writing the second pattern to the resist layer includes writing the second pattern to the resist layer in an e-beam lithography system utilizing a single e-beam.

11. The method of claim 9, wherein:
    the writing the first pattern to the resist layer includes writing the first pattern to the resist layer using a fixed dose; and
    the writing the second pattern to the resist layer includes writing the second pattern to the resist layer using a varying dose.

12. The method of claim 1, wherein the resist layer includes a resist material sensitive to electrons.

13. The method of claim 1, wherein the second pattern includes one or more critical features demanding additional exposure dose.

14. A method for electron-beam (e-beam) lithography patterning, comprising:
    receiving an integrated circuit (IC) structure;
    applying a shape correction to the IC structure;
    applying a dose correction to the IC structure; and
    generating a first pattern and a second pattern from the IC structure based on the dose correction,
    wherein the first pattern and the second pattern are used to form IC patterning in a multiple e-beam exposure process, and
    wherein the second pattern is a subset of the first pattern, each of the first pattern and the second pattern including one or more features of the IC structure.

15. The method of claim 14, further comprising:
    forming a resist layer on a substrate;
    performing a first e-beam exposure process to the resist layer according to the first pattern;
    performing a second e-beam exposure process to the resist layer according to the second pattern; and
    developing the resist layer.

16. The method of claim 15, wherein:
    the performing the first e-beam exposure process includes writing the first pattern to the resist layer in raster mode; and
    the performing the second e-beam exposure process includes writing the second pattern to the resist layer in vector mode.

17. The method of claim 15, wherein:
the performing the first e-beam exposure process includes writing the first pattern to the resist layer in raster mode; and
the performing the second e-beam exposure process includes writing the second pattern to the resist layer in raster mode.

18. The method of claim 14, wherein the second pattern is extracted from the IC structure and includes features demanding additional exposure dose.

19. A method for electron-beam (e-beam) lithography patterning, comprising:
receiving an integrated circuit (IC) pattern;
applying a shape correction to the IC pattern;
applying a dose correction to one or more features of the IC pattern, wherein the one or more features are a subset of the IC pattern;
performing a first e-beam exposure process to form the IC pattern in the resist layer;
performing a second e-beam exposure process to enhance imaging contrast of the one or more features in the resist layer; and
developing the resist layer.

20. The method of claim 19, wherein the one or more features of the IC pattern include circuit features.

* * * * *